(12) United States Patent
Cheung et al.

(10) Patent No.: US 6,621,758 B2
(45) Date of Patent: Sep. 16, 2003

(54) METHOD FOR PROVIDING A LOW POWER READ ONLY MEMORY BANKING METHODOLOGY WITH EFFICIENT BUS MUXING

(75) Inventors: Hugo Cheung, Tucson, AZ (US); Shang-Yuan Chuang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/138,386

(22) Filed: May 3, 2002

(65) Prior Publication Data

US 2002/0176291 A1 Nov. 28, 2002

Related U.S. Application Data

(60) Provisional application No. 60/289,007, filed on May 4, 2001.

(51) Int. Cl.[7] ............................................... G11C 8/00
(52) U.S. Cl. .............................. 365/230.03; 365/203
(58) Field of Search ............................. 365/230.03, 203

(56) References Cited

U.S. PATENT DOCUMENTS

| | | | |
|---|---|---|---|
| 4,443,845 A | * | 4/1984 | Hamilton et al. ........... 364/200 |
| 5,434,822 A | * | 7/1995 | Delegannes et al. ........ 365/203 |
| 5,615,383 A | * | 3/1997 | Caudel et al. .............. 395/800 |
| 5,959,883 A | | 9/1999 | Brennan, Jr. et al. ... 365/185.03 |
| 6,018,487 A | | 1/2000 | Lee et al. ................... 365/204 |
| 6,147,893 A | | 11/2000 | Liu ............................ 365/104 |
| 6,172,923 B1 | | 1/2001 | Liu ............................ 365/207 |
| 6,185,147 B1 | | 2/2001 | Liu ....................... 365/230.06 |
| 6,226,202 B1 | | 5/2001 | Kikuchi ................. 365/185.33 |

* cited by examiner

*Primary Examiner*—M. Tran
(74) *Attorney, Agent, or Firm*—W. Daniel Swayze, Jr.; W. James Brady; Frederick J. Telecky, Jr.

(57) ABSTRACT

A low power Read Only Memory (ROM) bank accessing system with efficient bust muxing is provided. The memory access system includes separate pre-charge and pre-discharge circuits for each bit lines in the ROM bank. In a ROM bank read operation, the pre-discharge circuits and pre-charge circuits are activated and deactivated in accordance with the address of the targeted ROM bank. In an exemplary embodiment, only the pre-charge lines corresponding to the bit-line of the targeted ROM bank are pre-charged prior to the ROM read operation. Similarly, only the pre-discharge circuit corresponding to the bit lines of the targeted ROM bank is deactivated during the ROM read operation, permitting the remaining bit lines from storing residual charge.

27 Claims, 8 Drawing Sheets

METHOD FOR PROVIDING A LOW POWER READ ONLY MEMORY BANKING METHODOLOGY WITH EFFICIENT BUS MUXING

CROSS REFERENCE TO RELATED APPLICATIONS

This application claims priority from U.S. Provisional patent application Ser. No. 60/289,007, filed May 4, 2001.

FIELD OF THE INVENTION

The present invention relates to Read Only Memory (ROM) devices for use with microcontroller-based products.

BACKGROUND OF THE INVENTION

The demand for higher performance, microcontroller-based products for use in communication and processing applications continues to increase rapidly. As a result, microcontroller-based product manufacturers are requiring the components and devices within these products to be continually improved to meet the design requirements of a myriad of emerging audio, video and industrial control applications.

These microcontroller-based products use various types of processors. Typical processors may include general purpose microprocessors for controlling the logic of various digital devices, such as clock radios, microwave ovens, digital video recorders and the like. Other microcontroller-based products may use special purpose microprocessors, such as math coprocessors for mathematical computations, or digital signal processors used in manipulating various types of information, including sound, imaging, video and industrial control information.

A typical microprocessor may include a central processing unit (CPU) core for facilitating processing functions, and a bus interface for communication with the various memory and peripheral devices.

For the storage of data, the microprocessor can include various types of memory. For example, the CPU for the microcontroller may include Random Access Memory (RAM) as well as Read-Only Memory (ROM), i.e., programmed memory. In addition, the microcontroller can also include flash memory which can be erased and preprogrammed in blocks instead of being programmed one byte at a time.

Beneficially, ROM is a non-volatile memory and, theoretically, can maintain the data it stores indefinitely without power. Inside ROM memory, data may be stored in memory cells and blocks of memory cells may be stored in separate memory banks. As discussed more fully below, by organizing the memory cells into a bank, bit line loading is reduced and ROM accessing speed is improved.

The basic component of a memory cell is a transistor and hence will be referred to as a memory cell transistor. In a typical ROM structure, the memory cell transistor is capable of generating a binary digit. A binary digit is either a logic '1' (high voltage level) or a logic '0' (low voltage level). In a typical memory cell arrangement, two sets of 8 transistors are grouped in each row to create two 'bytes,' or one 'word,' of information for a given row.

For a NOR logic arrangement of transistors, the memory cell transistors are arranged in a vertical column, are either uncoupled from a vertical metal line called a bit line or, are coupled in parallel to each other to the bit line. In addition, separate bit line exists for each vertical column of memory cell transistors. For example, sixteen bit lines exist for a word of bits (e.g. 16 binary digits or memory cell transistors in a row). The bit line communicates the actual logic level of the memory cell transistors to other portions of the ROM circuit. A y-decoder interprets an input address code to determine the appropriate bit line to which the address refers and then enables that bit line. With this grid of horizontal and vertical metal lines, each memory cell transistor, and its logic level, can be accessed by enabling the appropriate word line and appropriate bit line to which the desired memory cell transistor is coupled.

The gates of all the transistors in each row of a ROM may be suitably coupled to a horizontal conductor line referred to as a 'word line.' The word line is used to turn on the gates of all transistors grouped in that word line. Hence, the top word line, coupling sixteen memory cell transistors, may be referred to as word line 0, the second word line, linking sixteen different memory cell transistors, may be referred to as word line 1, and so on. An x-decoder may interpret an input address code to determine the appropriate word-line to which the address refers and then enables that word line.

Prior Art FIG. 2 illustrates a pair of conventional memory cell transistors as may be commonly found within a ROM circuit 200 (e.g., ROM bank). Memory cell transistor 202 represents a logic level '0' as its drain 203 couples bit line 204 to ground 290. When gate 216 of memory cell transistor 202 is enabled by word line 214, to which it is coupled, its source 218, may be coupled to ground 290. Thus, when bit line 204 is pre-charged, its voltage level may go to ground because of the coupling just described.

Conversely, memory cell transistor 206 may represent a logic level '1' as its drain 207 is uncoupled from bit line 208. When gate 212 of memory cell transistor 206 is enabled by word line 214, to which it is coupled, its source 210, coupled to ground 290, may thereby be coupled to ground 290 via its drain 207. Thus, when bit line 208 is pre-charged, its voltage level may remain at the voltage level of the pre-charge because of the coupling arrangement just described.

A data read operation (e.g., read request) of a ROM may typically be divided into three periods: bit line pre-charge, data sensing, and data output periods. At the beginning of the data read operation (i.e., the pre-charge period), all ROM banks, including the bit lines, may typically be pre-charged to a predetermined voltage (e.g., 1 V to 2 V) in order to enhance the sensing gain and increase the data sensing speed. Thereafter, the voltage level on the selected bit line within a ROM bank which is coupled with a selected memory cell may be sensed to determine whether the selected cell is an "on-cell" that presents a current path between a corresponding bit line and a voltage supply of a reference voltage (e.g., ground voltage), or "off-cell" during no current path between them. It is commonly assumed that the on-cell may be programmed to a logic "0" and the off-cell a logic "1." Lastly, the sensed data may be output to exterior signal receiving devices.

One problem inherent in the above read method is that the method involves providing power to all available ROM banks. Particularly, the read method involves providing power to ROM banks which will not be accessed, and hence the provided power may be unnecessarily consumed. That is, it should be understood that in order to read from the ROM, all available ROM banks are generally first pre-charged during the pre-charge period, irrespective of whether the ROM bank is to be accessed. Therefore, a need exist for a method of accessing ROM banks and bit lines within ROM banks which will pre-charge only those ROM banks which are to be accessed, thereby, ensuring that the unnecessary consumption of power is minimized.

Conventional methods which have focused on pre-charging only select ROM banks or select bit lines within select ROM banks have encountered the problem often described as "cross talk." Typical prior art methods which experience "cross-talk" include those described in U.S. Pat. No. 6,172,923 issued Jan. 9, 2001 to Lui and U.S. Pat. No. 6,185,147 issued Feb. 6, 2001 to Lui both incorporated herein by reference, in their entirety. A clear understanding of cross-talk may be had with continued reference to FIG. 2 as discussed below. FIG. 2 schematically illustrates a memory cell array of a conventional ROM, where the conventional sensing operation of a memory cell only references one memory cell 202. This, in turn, means that, although not indicated in FIG. 2, the balance of the memory cells in the ROM circuit are left floating with whatever "residual charges" since those memory cells are charged during the read operation but not read (e.g. discharged).

Unfortunately, the residual charges left on disabled bit lines effects the read operation targeted at an enabled bit line. For example, the residual charge remaining on the disabled bit line will be sensed by the enabled bit line which retards the enabled bit line's ability to accept a pre-charge. This, in turn, will influence the phase and amplitude of the signal read from the enabled bit line during the subsequent sensing operation. This influence, commonly referred to as "cross-talk," consumes some of the noise margin in the sensing operation and may lead to errors in output and overall degradation in speed performance of the ROM circuit.

Conventional methods for minimizing cross-talk typically involve discharging all available ROM banks following a ROM read operation. In general, discharging the ROM banks includes minimizing the residual floating voltages (e.g., residual charges) which remain on the bit lines by sending the voltages to a grounding potential.

Pre-charging and subsequently discharging unselected bit lines of all available ROM banks, however, consumes power without contributing to the final ROM access results. For example, where similar number of on-cell and off-cell patterns are pre-programmed in the ROM banks the power consumption for each bank would be of a similar power level (P). The power consumption for a number n of ROM banks which are pre-charged and discharged using conventional methods would then be n times P (nP), which would mean that nP power is consumed when it may be desired to access only one ROM bank. As such, a need exists for an improved method of accessing bit lines in a ROM structure which allows for the pre-charging of only select bit lines and, additionally, compensates for presence of cross-talk.

SUMMARY OF THE INVENTION

The system and method for accessing data stored in ROM according to the present invention addresses many of the shortcomings of the prior art. In accordance with various aspects of the present invention, an improved data retrieval method for ROMs is provided which allows for the pre-discharging and pre-charging of only the select ROM banks, thereby reducing the overall power consumption of ROM data sensing system. In one exemplary ROM access operation in accordance with this invention, each ROM bank within a ROM structure is provided with a separate pre-charge line and pre-discharge circuit and corresponding pre-charge and pre-discharge selection control circuitry. An address corresponding to information stored in a ROM bank is provided to an address decoder. The address decoder may decode the data location and send the decoded data location to at least one of a pre-charge and pre-discharge selection control circuitry. The pre-charge selection/control circuitry may receive the decoded address and select the corresponding ROM bank for pre-charging. In addition, the decoded address information may be provided to the pre-discharge selection control circuitry for use in determining whether to disable the pre-discharge line circuitry, permitting the bit line of a selected bank to be charged.

Upon receiving the decoded address information the pre-discharge circuitry may disenable the pre-discharge circuitry corresponding to the desired ROM bank. The pre-charge circuitry for the desired ROM bank may then be activated, permitting the bit lines of the desired ROM bank to be charged to a predetermined voltage level, which allows the data stored in the ROM bank to be accessed (e.g., read or retrieved).

In accordance with one exemplary embodiment of this invention, the pre-charging and pre-discharging a predetermined number of the ROM bank bit lines may be performed simultaneously. Alternatively, the ROM bank may be discharged prior to pre-charging. Further still, in accordance with another embodiment, the pre-discharge circuitry for all available ROM banks may be enabled prior to, and at the completion of, a ROM bank access operation.

In accordance with one exemplary embodiment of the present invention, separate pre-charge lines and pre-discharge circuitry are provided for each ROM bank for pre-charging and pre-discharging the ROM bank. A ROM address decoder is used to decode the address of the ROM bank to be accessed. The decoded ROM bank address is then used to identify ROM bank selected for access. The selected ROM bank is then pre-discharged prior to subsequent pre-charging during a ROM access operation.

In accordance with another exemplary embodiment of the present invention, a pre-discharge circuit is provided for pre-discharging selected ROM banks prior to a ROM access operation.

In accordance with yet another exemplary embodiment of the present invention, a pre-charge selection control circuit is provided for selecting a ROM bank and for ensuring that only the selected ROM bank is pre-charged in the performance of a ROM access operation.

In accordance with still another exemplary embodiment of the invention, a method for accessing ROM comprises pre-discharging predetermined bit lines and then charging only select bit lines.

In accordance with another embodiment of the present invention, a method for accessing ROM comprises simultaneous pre-charging and pre-discharging of predetermined bit lines.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. In addition, the present invention may be practiced in any conventional microcontroller-based application. Such general applications that may be appreciated by those skilled in the art in light of the present disclosure are not described in detail herein. However for purposes of illustration only, exemplary embodiments of the present invention will be described herein in connection with a microcontroller. Further, it should be noted that while various components may be suitably coupled or connected to other components within exemplary circuits, such connections and couplings can be realized by direct connection between components, or by connection through other components and devices located therebetween.

The operation of the present invention will now be described with reference to the attached Figures. It should be noted that the Figures are merely illustrative of the operation of the invention, and as such, are not limiting on the scope of the invention. Indeed, the ROM structure depicted in the attached Figures may be any conventional ROM structure commonly found in the art of computer memory.

Figure 1:
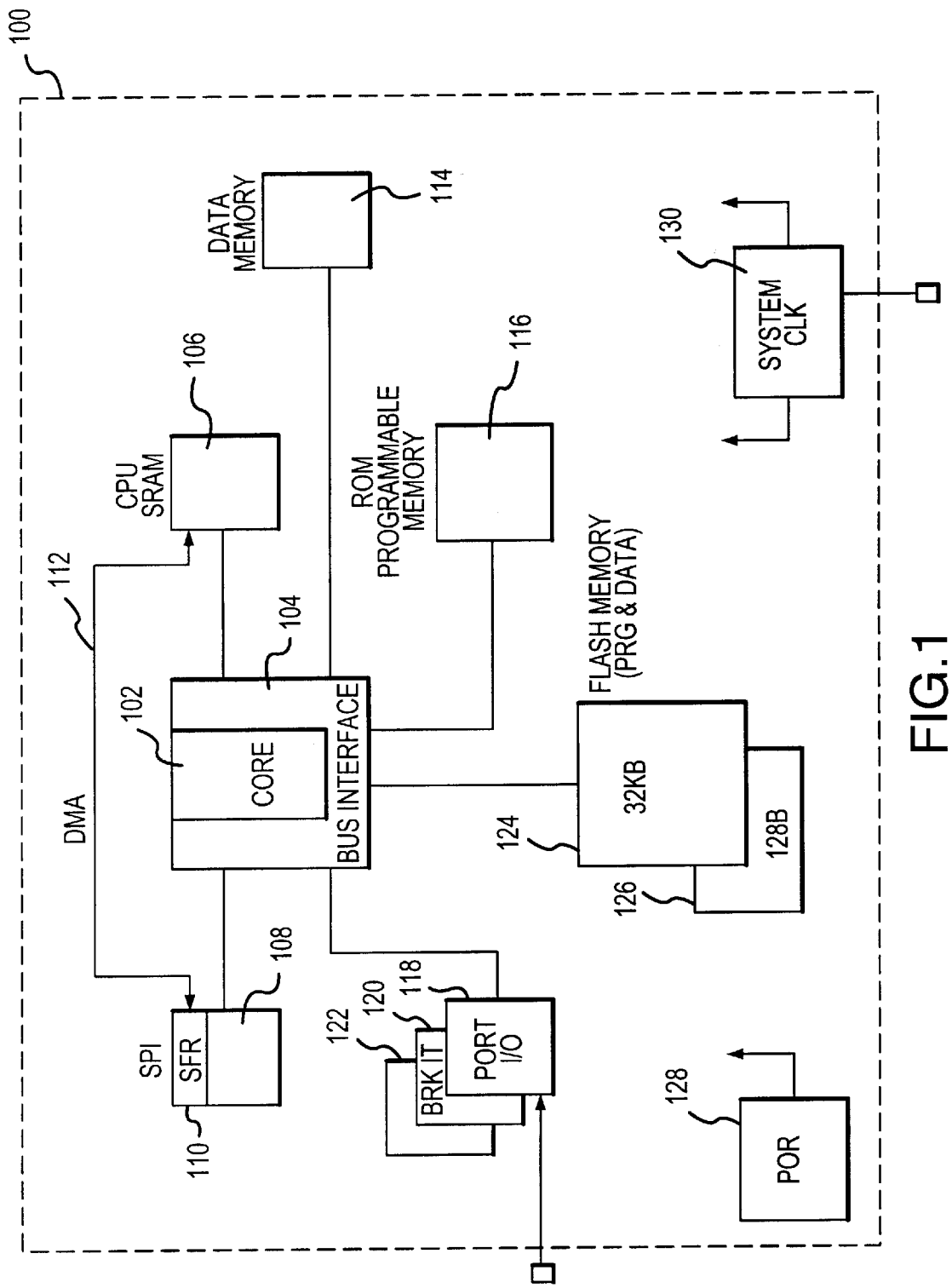
FIG. 1 illustrates a block diagram of an exemplary microcontroller in accordance with an exemplary embodiment of the present invention.

With reference to FIG. 1, an exemplary microcontroller 100 for use with the present invention is illustrated. Microcontroller 100 suitably comprises a central processing unit (CPU) core 102 configured for the processing of data, and a bus interface 104 for communication with the various memory or input and output devices. For the storage of data, microcontroller 100 can comprise various types of memory. For example, microcontroller 100 can comprise an internal CPU static random access memory (SRAM) 106 which can provide very low access time, e.g., as low as 10 nanoseconds. In addition, microcontroller 100 can also include data memory 114 which can also comprise SRAM-type memory, and read-only memory (ROM) 116 which can comprise the programmable memory for the microcontroller 100. Still further, microcontroller 100 can also include flash memory for the programming and storage of data, such as a large page of memory 124 comprising, for example, 32 KB of data storage, as well as a smaller configuration of flash memory 126, comprising, for example, 128 kilobytes. For the transmitting and receiving of data between various components, microcontroller 100 can also comprise serial peripheral interface (SPI) 110 which can communicate with the CPU memory 106 via direct memory access (DMA) 112, i.e., SPI 108 can transfer data from main memory to a device without passing the data through the CPU.

In addition, the microcontroller 100 can also include various input output devices. For example, an I/O port device 118 can be provided, as well as a breakpoint device 120. Further, microcontroller 100 can also include a system clock 130 for providing clock cycles for triggering various functions and sequences during operation. Microcontroller 100 can also include a Power On Reset (POR) 128 for use during ramping up of a power supply.

Further, it should be noted that microcontroller 100 may be realized by any number of hardware or software components configured to perform the specified functions. For example, the present invention may employ various integrated circuit components, e.g., memory elements, digital signal processing elements, logic elements, look-up tables, and the like which may carry out a variety of functions under the control of one or more microprocessors, microcontrollers or other control devices. In addition, those skilled in the art will appreciate that the present invention may be practiced in conjunction with any number of external memory interface management systems, wherein it may be necessary to communicate to various external memory units, such as,. for example, Dynamic Random Access Memory ("DRAM"), Static Access Memory ("SRAM"), external Flash Memory, Read only memory ("ROM"), Random Access Memory ("RAM"), and the like. In addition, those skilled in the art will appreciate that the present invention may be practiced in any number of microprocessing or data processing contexts wherein it may be necessary to transfer data to and from an external memory unit and, therefore, the exemplary embodiment relating to an internal memory unit as described herein is merely one exemplary application for the invention.

Figure 2:
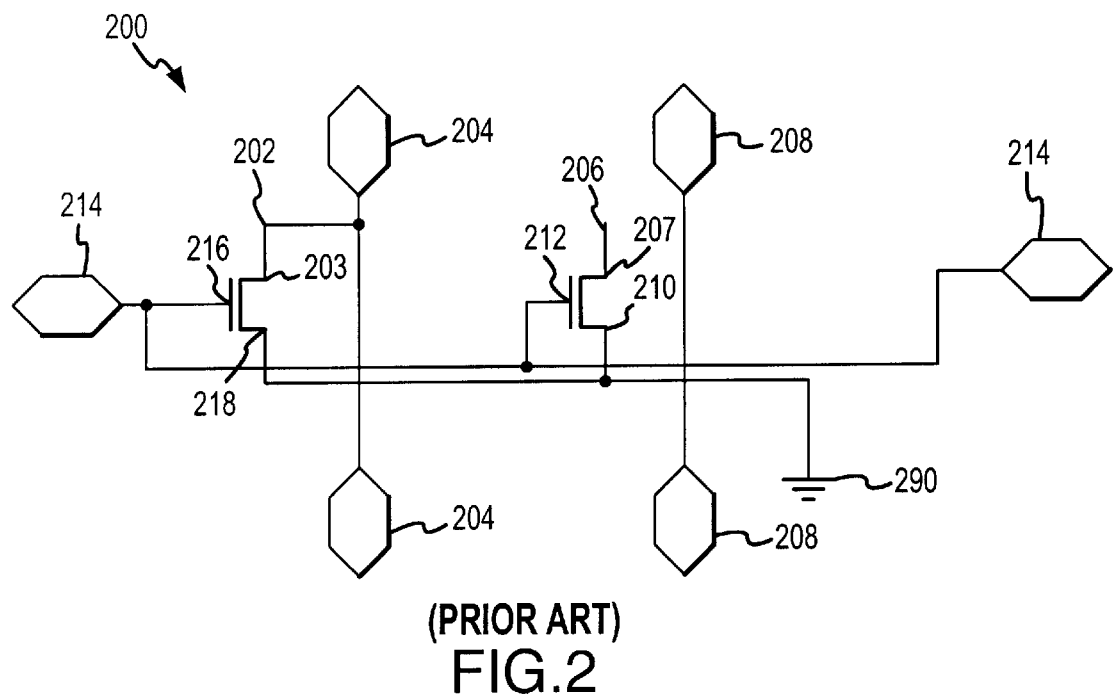
FIG. 2 illustrates a prior art schematic diagram of an exemplary memory cell transistor pair in accordance with the present invention.

As discussed above, previous attempts for providing a power efficient ROM accessing methods have been unsuccessful in that they involve the pre-charging of ROM banks which are not to be accessed (e.g., read or retrieved). Such a typical method may be described with respect to FIG. 3, below. For example, with respect to FIG. 3 what is shown is a typical ROM structure 300 in accordance with the present invention. In general, the ROM structure 300 may comprise a row address decoder 302, ROM memory banks B(1)–B(n), and a ROM bank address decoder 304. Row address decoder 302 may be suitably coupled to ROM memory banks B(1)–B(n) via word lines WL(0)–WL(m). In addition, ROM memory banks B(1)–B(n) may be suitably coupled to bank address decoder 304 via bank data output bus lines 306. Further, ROM bank pre-charge lines 308 are provided to each ROM bank for use in pre-charging the ROM bit lines, for example as illustrated in FIG. 2, which are included in each bank. By separating the ROM into banks bit line loading is reduced and ROM access time is improved.

Row address decoder 302, ROM memory banks B(1)–B(n), and bank address decoder 304 may be of any conventional construction for performing the functions described herein. An exemplary row address decoder 302 in accordance with the present invention may be implemented by synthesis of Hardware Description Language (HDL) with other logic implementations such as static cmos, dynamic mos, or any similar row address decoder logic. Further, an exemplary bank address decoder 304 which may be used with the present invention may also be implemented by synthesis of HDL similar to that discussed with respect to the row address decoder 302.

Figure 3:
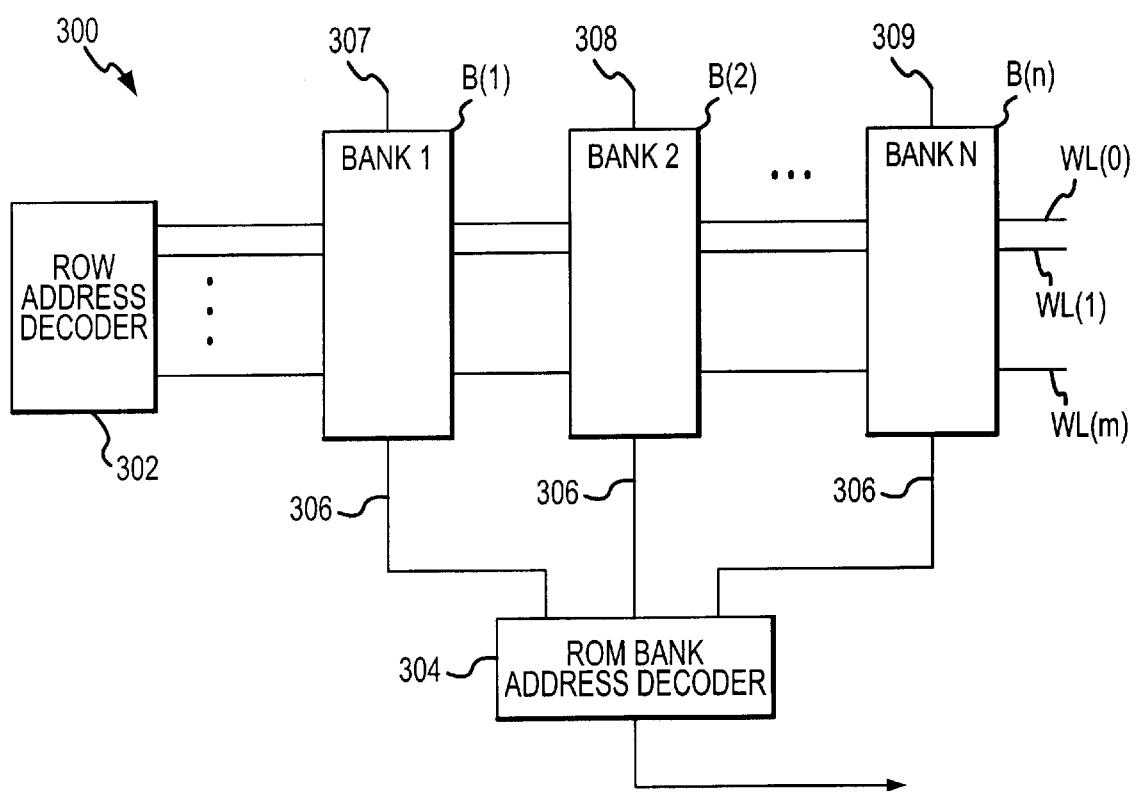
FIG. 3 illustrates a ROM structure in accordance with the present invention.

During operation of the ROM structure 300 shown in FIG. 3, the address decoder may generate a wordline address which identifies the wordline, WL(0)–WL(m) to be activated. A voltage may be sent to at least one of the precharge lines 308 for precharging the ROM bit lines of the corresponding ROM bank B(1)–B(n). The bit line information corresponding to the activated wordline may be read by the ROM bank address decoder 304 and provided as ROM data output to the CPU bus 102 via interface 104.

As noted, the typical prior art ROM accessing method involves first pre-charging all banks B(1)–B(n) prior to reading the data using the ROM bank address decoder 304. Such pre-charging of all banks unnecessarily consumes power (P). For example, where n banks are pre-charged, nP power is consumed when only one ROM bank is identified as storing the desired data. As described below, the present invention eliminates the need to pre-charge all available ROM banks. That is, the present invention only pre-charges the ROM bank wherein the desired information is stored, thereby reducing power consumption by a factor of n. The undesired ROM banks are not pre-charged during the ROM access operation. Consequently, where only one bank contains the desired information only P power is used in a ROM access operation.

Figure 4:
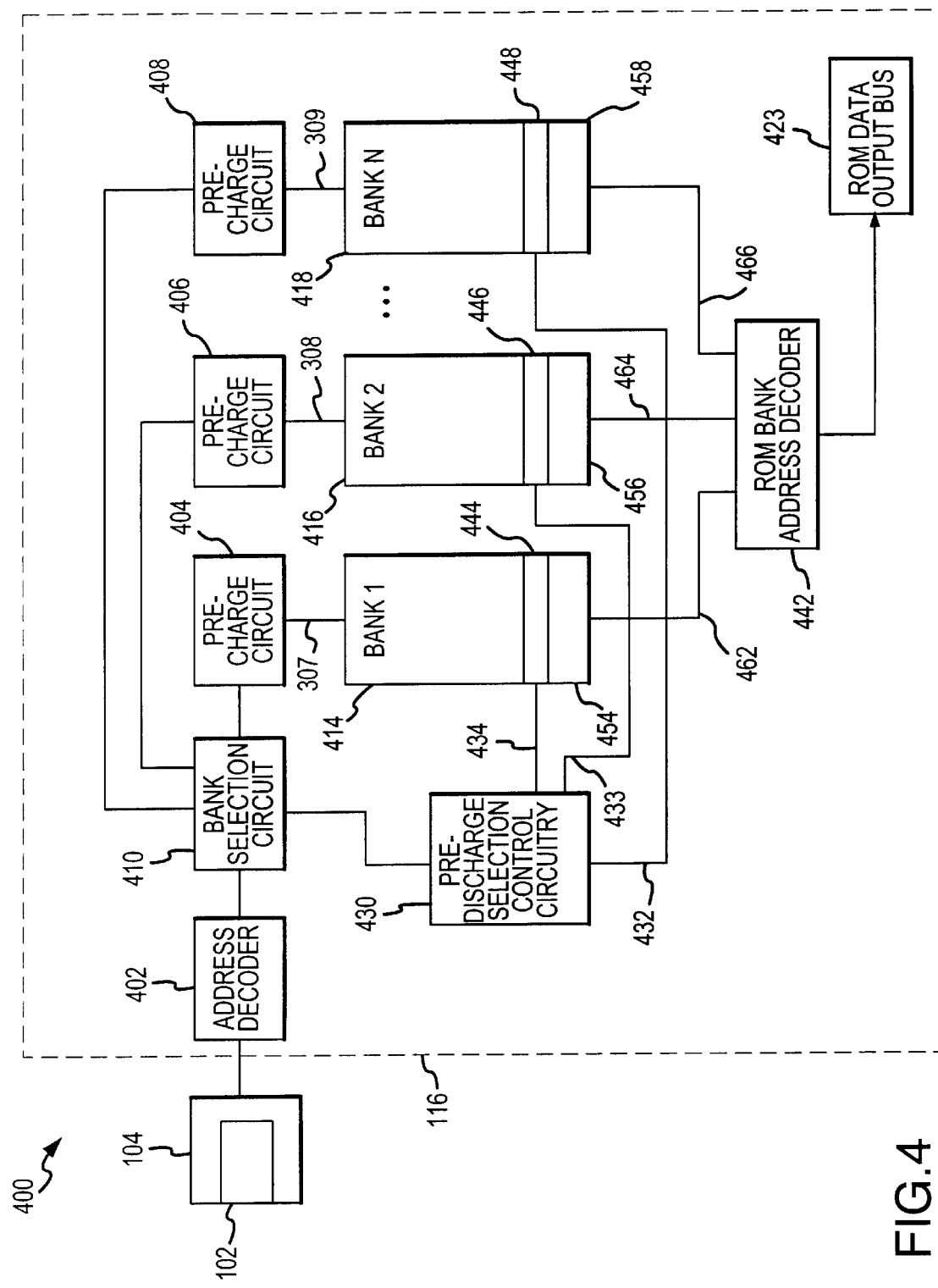
FIG. 4 illustrates a ROM access system in accordance with the present invention.

FIG. 4 illustrates an exemplary ROM access system 400, in accordance with this invention. ROM access system 400 may include a CPU core 102 and bus interface of 104 of similar description as like elements of FIG. 1, which is suitably coupled to a ROM structure 116. ROM structure 116 may further include a ROM bank address decoder, 402 coupled to a bank selection circuit 410. Bank selection circuit 410 may be further coupled to pre-charge circuitry 404, 406, and 408, wherein each pre-charge circuit corresponds to, and is coupled to, separate ROM banks 414, 416, 418. Further, ROM structure 116 may include a pre-discharge selection control circuit 430 coupled to ROM banks 414, 416, 418 via pre-discharge lines 432, 433, 434. Separate ROM banks 414, 416, 418 are further coupled to bank address decoder 442, which receives data from the desired (e.g., selected) ROM bank for decoding the data and outputting the data to a read device (not shown).

Address decoder 402 and bank address decoder 442 may be of any conventional structure for decoding a ROM address or bank address. In particular, exemplary address decoder 402 and bank address decoder 442 may be of similar description as like elements in FIG. 3, discussed above.

Figure 5:
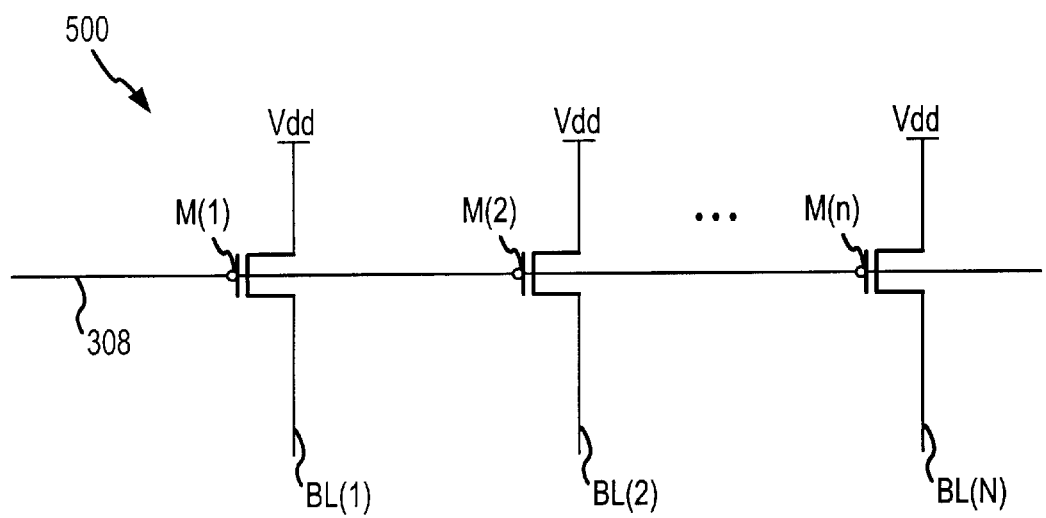
FIG. 5 illustrates an exemplary pre-charge circuit in accordance with the present invention.

As noted, each separate ROM bank 414, 416, 418 may be provided with a corresponding individual pre-charge circuits 404, 406, 408. FIG. 5 illustrates an exemplary pre-charge circuit 500 in accordance with one embodiment of the invention, where pre-charge circuit 500 may be any one of pre-charge circuits 404, 406, 408, although the pre-charge circuit is illustrated with respect to Bank 2, 416. As shown in FIG. 5, each bit line BL(1)–BL(n) is coupled to a voltage service Vdd via a corresponding transistor M(1)–M(n). When a particular pre-charge circuit 500 is enabled for an individual bank 414, 416, 418, bit lines BL(1)–BL(n) of the selected ROM bank 414, 416, 418 may be pre-charged to a predetermined voltage level, such as that provided by Vdd (e.g., the ROM power supply). In this way, only those banks wherein the pre-charged circuit 500 has been enabled consumes the power given by the Vdd.

Prior to enabling the pre-charge circuit 500, the bit lines BL(1)–BL(n) of a desired ROM bank may be discharged. In particular, in accordance with one exemplary embodiment of the present invention, a pre-discharge circuit 444, 446, 448 shown in FIG. 4 may be provided which allows the ROM banks to remain at idle when unselected. That is, the pre-discharge circuit 444, 446, 448 provides for the unselected ROM banks to be free, or substantially free, of residual charges when not selected, thereby substantially reducing the occurrence of "cross-talk." With reference to FIG. 4, it can be seen that, in an exemplary ROM access system 400 in accordance with the present invention, a pre-discharge selection control 430 may be coupled to the bank selection circuit 410 and to banks 414, 416, 418 via the pre-discharge circuitry 444, 446, 448. Alternatively, pre-discharge circuit arrangement 430 may be connected to address decoder 402 and to pre-discharge circuitry 444, 446, 448 or to pre-charge circuitry 404, 406, 408 and to banks 414, 416, 418. Further still, in one exemplary arrangement, pre-discharge circuitry 444, 446, 448 may be made integral to ROM bank 414, 416, 418.

Figure 6:
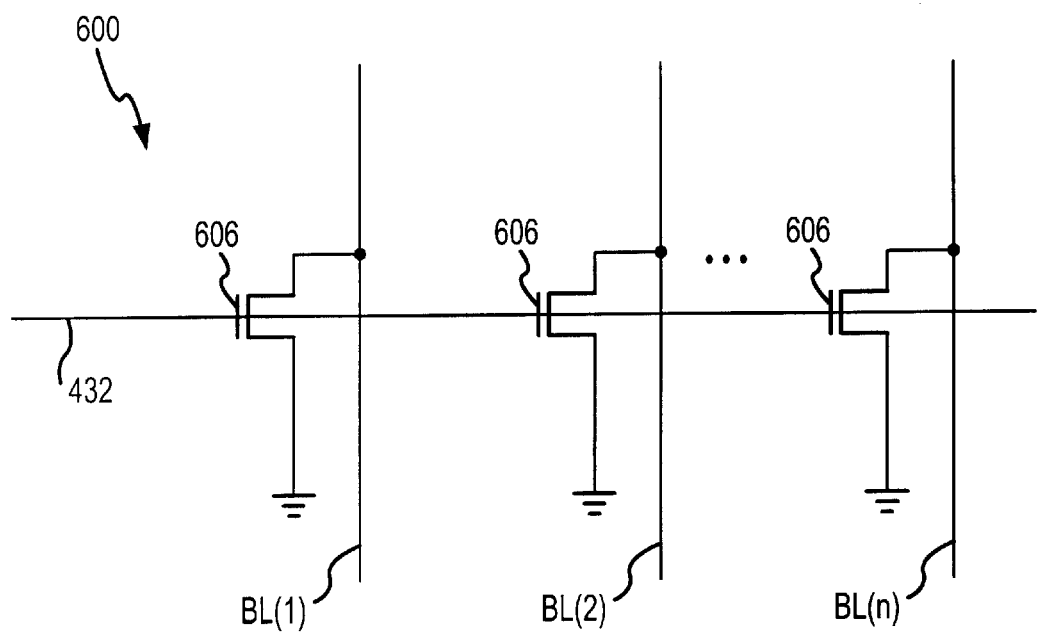
FIG. 6 illustrates an exemplary pre-discharge circuit in accordance with the present invention.

FIG. 6 illustrates an exemplary pre-discharge circuit arrangement 600 in accordance with an exemplary embodiment of the invention. Pre-discharge circuit arrangement 600 may include pre-discharge control circuitry 430, wherein at least one pre-discharge line 432, 433, 434 is provided to each individual ROM bank 414, 416, 418, for discharging ROM bank bit lines BL(1)–BL(n). More particularly, an individual pre-discharge line (e.g. discharge line 432) may be coupled to each bit line BL(1)–BL(n) via selective grounding circuitry, such as, for example transistors 606. Transistors 606 may be any suitable transistor for enabling the charge on bit lines BL(1)–BL(n) to be sent to ground when the circuitry is enabled. That is, once a particular pre-discharge line 432, 433, 434 is enabled, any residual charges contained inside the particular ROM bank 414, 416, 418 will be discharged to ground.

In a typical process for retrieving data stored in a ROM bank (e.g., ROM bank 414) a ROM address corresponding to the ROM bank 414 may be provided to address decoder 402 by CPU 102 via bus interface 104. At address decoder 402, the address corresponding to the ROM bank 414 (called "the desired ROM bank") containing the desired stored data, may be parsed into a ROM address and a ROM bank address. The ROM bank address information may be provided to a bank selection circuit 410 for identifying the ROM bank to be pre-charged. The bank selection circuit 410 may send a signal to a pre-charge circuitry (e.g., pre-charge circuitry 404 for bank 414) for initiating the charging of the bit lines BL(1)–BL(n) of only the desired ROM bank 414. As noted, bit lines BL(1)–BL(n) may be charged by a charge provided by a ROM power supply Vdd, shown in FIG. 5.

In one exemplary embodiment of the present invention, ROM bank address information may additionally be provided a pre-discharge selection control circuit 430, for use in determining which ROM bank pre-discharge line 432, 433, 434 to deactivate. As noted, separate pre-discharge lines 432, 433, 434 are provided for each individual ROM bank. For example, FIG. 4 depicts separate pre-discharge lines 432, 433, 434. Prior to initiating a ROM access operation, the individual pre-discharge lines 432, 433, 434 corresponding to each individual ROM bank 414, 416, 418, may be activated. In particular, the activated pre-discharge lines 432, 433, 434 may be configured as described with FIG. 6, such that any charges (e.g., "residual charges") contained on the bit lines will be discharged to ground via transistors 606. Upon initiation of the ROM access operation, ROM address information may be provided to the pre-discharge circuitry 430 for use in identifying the desired ROM bank to be discharged. Once the desired ROM bank is identified, the pre-discharge selection control circuitry 430 may deactivate the pre-discharge line 432, 433, 434 corresponding to the bit lines BL(1)–BL(n) of the desired ROM bank. Upon deactivation of the pre-discharge line, the bit lines BL(1)–BL(n) are uncoupled from the grounding potential, permitting the bit line BL(1)–BL(n) to be charged as indicated above.

It should be noted that in a typical ROM access operation in accordance with this invention, only the desired ROM bank is pre-charged since the bank selection circuitry 410 may only activate the pre-charge line for the desired ROM bank. Additionally, only the pre-discharge line 432, 433, 434 corresponding to the desired ROM bank may be deactivated permitting the bit lines BL(1)–BL(n) of the desired ROM bank to be charged. The pre-discharge lines corresponding to the remaining undesired ROM banks remain activated so that any residual charges on the corresponding bit lines for those banks will be discharged. Further, once the ROM access operation is complete, the pre-discharge line corresponding to the desired ROM bank 414, may again be activated, placing the ROM bank activation state in "idle" and sending any residual charge on the desired ROM bank 414 to ground.

It should be noted that the pre-charging and pre-discharging steps of the ROM access operation may be carried out simultaneously or, as in another exemplary embodiment, the pre-discharging may be carried out prior to pre-charging the bit lines BL(1)–BL(n). Further, the bank selection circuiting 410, may be any circuitry suitable for receiving a bank address and providing a signal output corresponding to a selected ROM bank location. In this way, only the bit lines of the selected ROM bank may be charged via the pre-charge circuit 404, 406, 408. Further, once the ROM access operation is completed, the pre-discharge line corresponding to the desired ROM bank is re-activated sending any residual charge on the desired ROM bank to ground. This, in turn, means that at the completion of the ROM access operation the pre-discharge lines for all available ROM banks will be activated, ensuring that no residual charge remains on any of the available ROM banks. For the purposes of the description of this exemplary embodiment, the condition wherein all pre-discharge lines for all available ROM banks are activated, is called "idle" state. As should be understood, then, "idle" state may occur before commencement of a ROM read operation or at the completion of such operation.

Figure 7:
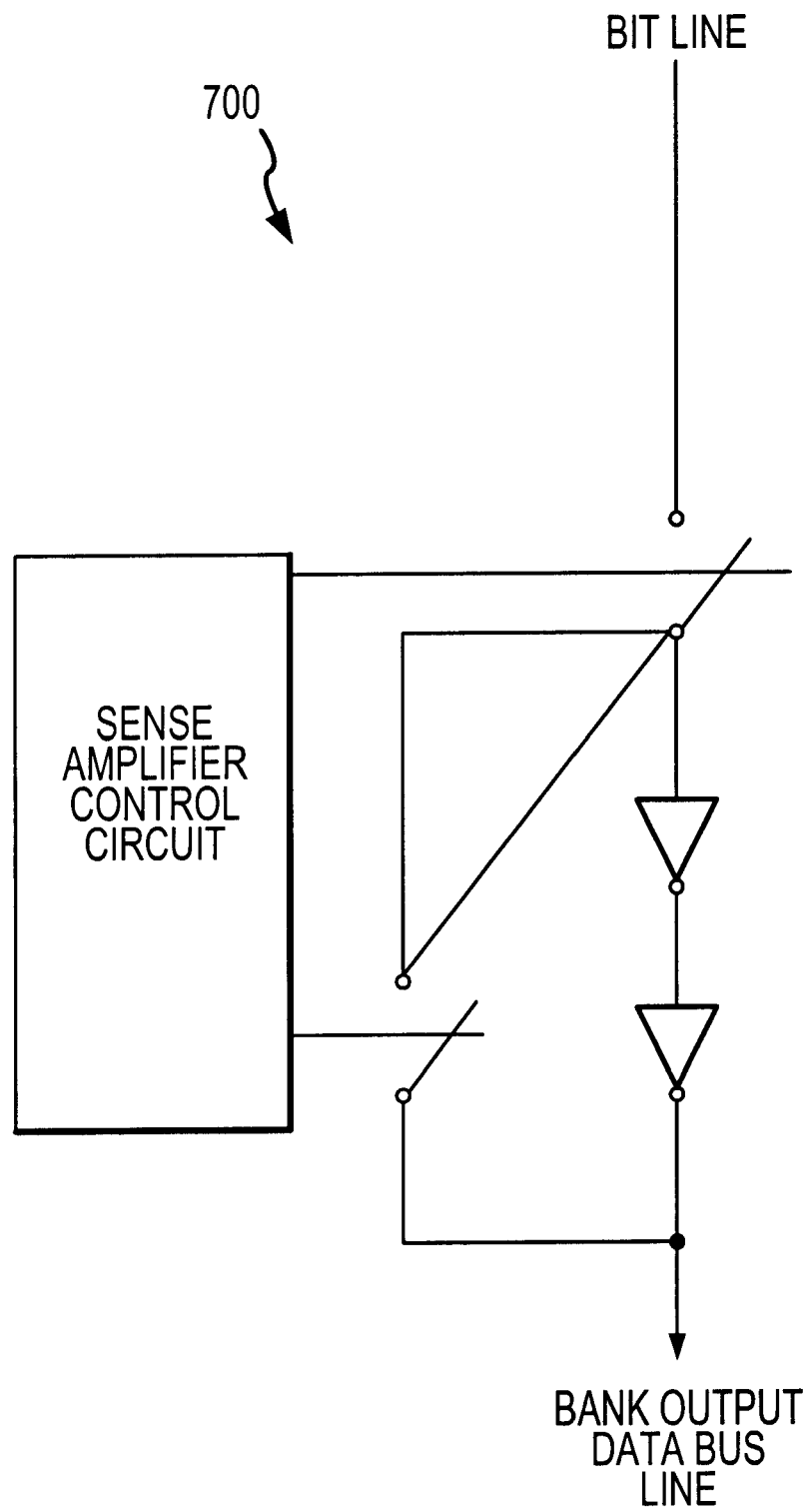
FIG. 7 illustrates an exemplary sensing amplifier timing circuit.

It should also be noted that each ROM bank, in accordance with exemplary embodiments of the present invention, includes a Bit Line Sensing Circuit (BLSC) 454, 456, 458 an example of which is illustrated in FIG. 4. The BLSC 454, 456, 458 may be configured to provide the output corresponding to the information stored in the desired ROM bank 414, 416, 418. In one exemplary embodiment, BLSC 454, 456, 458 may be comprised of the bit lines BL(1)–BL(n) of the ROM bank 414, 416, 418, wherein each bit line BL(1)–BL(n) is coupled to a sense amplifier timing control circuit 702 shown in FIG. 7. Such a sense amplifier timing control circuit 702 is well known in the art and as such will not be discussed herein for brevity. Further, although the BLSC 454, 456, 458 are illustrated using sense amplifier timing control circuit 702, the invention is not to be so limited. For example, other circuits for amplifying the signal received from a bit line BL(1)–BL(n) and constructing a ROM bank output bus 444, 446, 448 may be used, such as, for example, any conventional cross-couple-inverter as are commonly used as a sense amplifiers.

Figure 8:
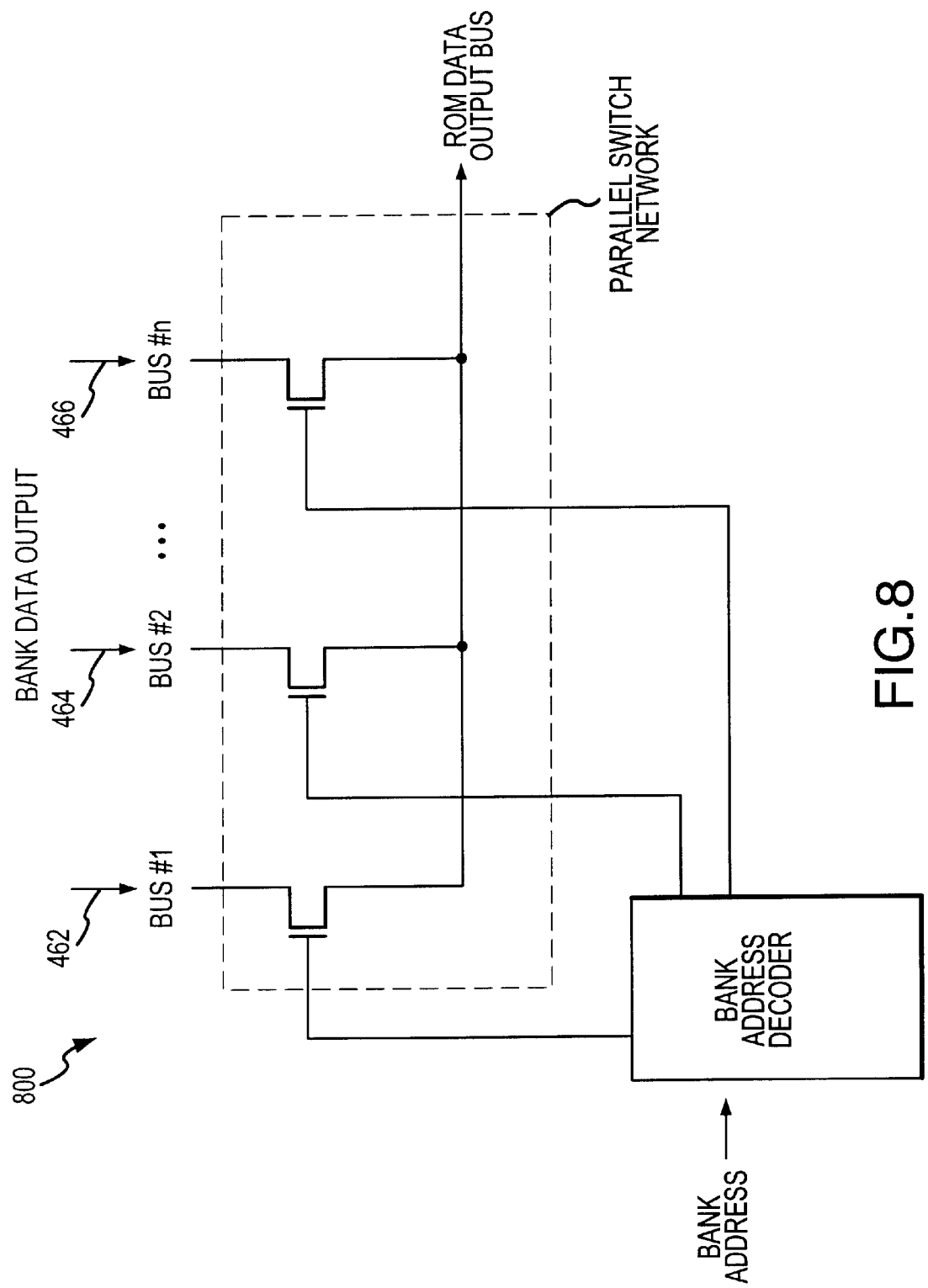
FIG. 8 illustrates a parallel data bus decoder system.
Figure 9:
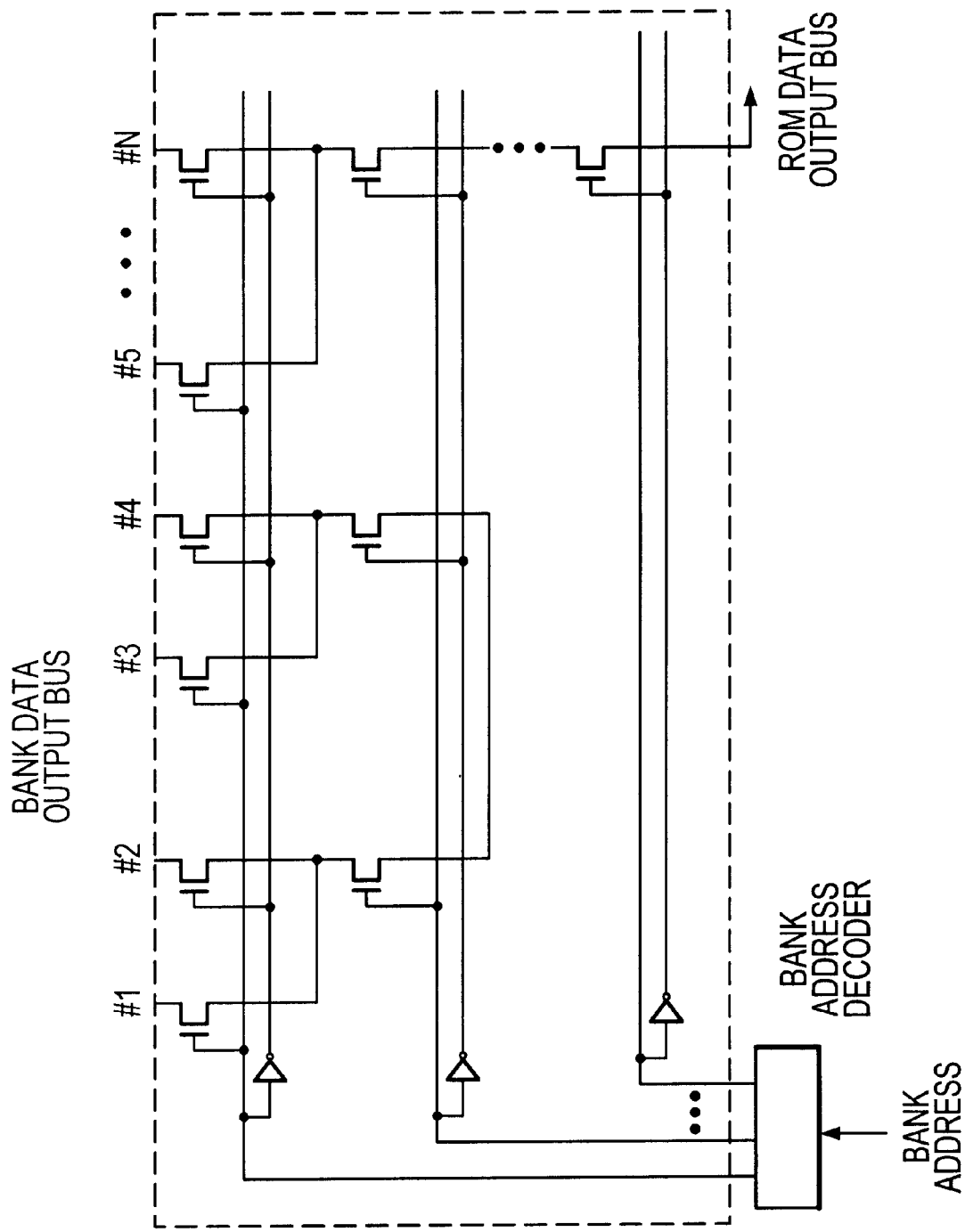
FIG. 9 illustrates a tree structure data bus decoder.

As noted, in a typical ROM access operation, the desired ROM address may be broken into a ROM address and ROM bank address. In accordance with one exemplary embodiment of the present invention, the ROM bank address may be provided to a bank address decoder 442 for decoding the data stored in the selected ROM bank and outputting the data to a ROM data output bus 423. In accordance with another exemplary embodiment, the address decoder 422 may include a circuit for selecting one of the bank output bus lines 462, 464, 466 and permitting transfer of data to ROM data output bus 423. Such a circuit arrangement included in address decoder 442 may be shown in FIG. 8, wherein is illustrated a parallel data bus decoder system 800. While FIG. 8 illustrates an exemplary decoder system for use with this invention, it should be understood that other decoder arrangements may be used, such as for example the tree-structure data bus decoder illustrated in FIG. 9 or the OR gate structure of FIG. 10 for outputs of the output data bus 454, 456, 458. The operation of the structures of FIGS. 8 and 9 are well understood in the art. As such, their operation will not be discussed herein for brevity.

Figure 10:
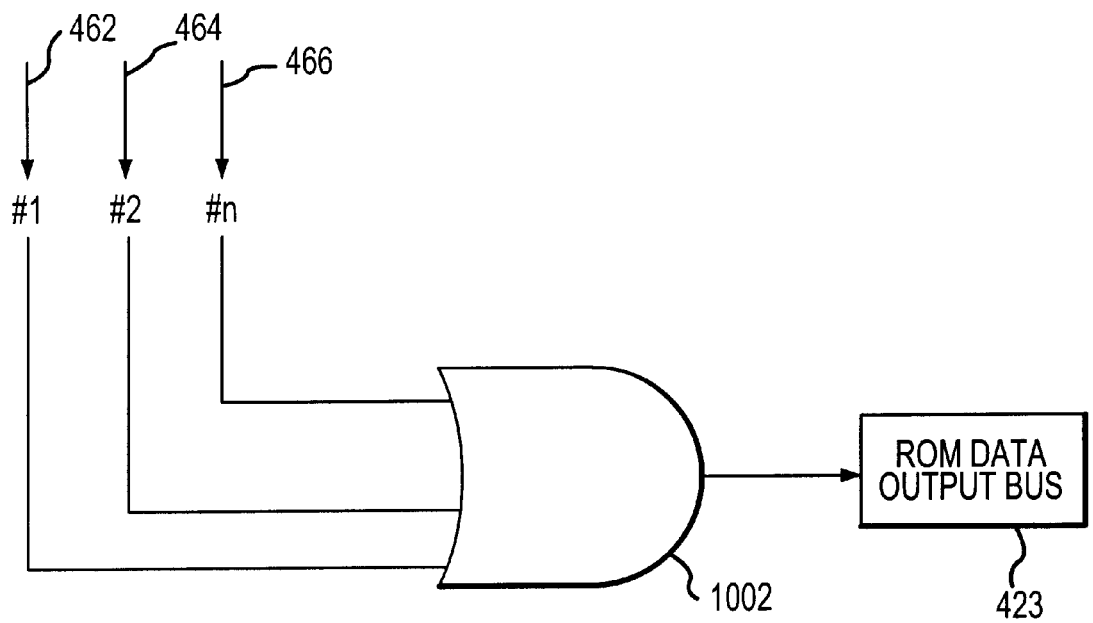
FIG. 10 illustrates an OR gate structure bank selection device.

As noted, FIG. 10 illustrates a bus-type OR gate structure 1002 which may be included in ROM Bank Address Decoder 442. As previously described, the precharging and predischarging of circuit bitlines may occur simultaneously. Further, the CPU core 104 may send a read request to Address Decoder 402 for decoding the addresses of multiple bitlines where it is desired to read more than one bit line. The bank selection circuit 410 may further send signals to the more than one precharge circuit 404, 406, 408 for precharging the targeted (e.g., selected bitlines), and to predischarging circuit 430 for selecting which bitlines 432, 433, 434 to be discharged. The output from the ROM Bank 414, 416, 418 may be provided to the ROM Bank Address Decoder 442, via output bus lines 462, 464, 466. In this instance, ROM Bank Address Decoder 442 may include a bus-type OR Gate Structure 1002 for receiving the data provided by output bus lines 462, 464, 466 and providing to ROM Data Output Bus 423 only the data stored on the targeted bitlines.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as varying or alternating the steps in different orders. These alternatives can be suitably selected depending upon the particular application or in consideration of any number of factors associated with the operation of the system. In addition, the techniques described herein may be extended or modified for use with other types of devices, in addition to the microprocessor or to any other data processing devices. For example, data acquisition system, industrial control, as well as hand-held equipment. These and other changes or modifications are intended to be included within the scope of the present invention.

Accordingly, What is claimed is:

1. A low power Read Only Memory bank accessing system with efficient bus muxing for use with a microcontroller, comprising:
   (a) A Read Only Memory (ROM) Circuit, including at least a first ROM memory bank characterized by a first ROM memory bank address and a second ROM memory bank characterized by a second ROM memory bank address, wherein said first ROM memory bank and said second ROM memory bank further include a plurality of programmable memory cells for use in storing data said memory cell characterized by a logic level;

(b) at least a first bit line coupled to at least one of said plurality of programmable memory cells of said first ROM memory bank;

(c) at least a second bit line coupled to at least one of said plurality of programmable memory cells of said second ROM memory bank;

(d) a first pre-charge circuit coupled to said first bit line for pre-charging said at least one of said plurality of programmable memory cells of said first ROM memory bank;

(e) a second pre-charge circuit coupled to said second bit line for pre-charging said at least one of said plurality of programmable memory cells of said second ROM memory bank;

(f) a first pre-discharge circuit coupled to said first bit line for pre-discharging said at least one of said plurality of programmable memory cells of said first ROM memory bank;

(g) a second pre-discharge circuit coupled to said second bit line for pre-discharging said at least one of said plurality of programmable memory cells of said second ROM memory bank;

(h) a central processing unit for providing a desired ROM memory bank address, said desired ROM memory bank address corresponding to at least one of said first ROM memory bank and said second ROM memory bank;

(i) a ROM memory bank address decoder for decoding said desired ROM memory bank address and providing at least one of said first ROM memory bank address and said second ROM memory bank address; and (j) a ROM memory bank selection circuit for receiving at least one of said first ROM memory bank address and said second ROM memory bank address, said ROM memory bank selection circuit further providing a first pre-charge signal to at least one of said first pre-charge circuit and said second pre-charge circuit, said ROM memory bank selection circuit further providing a first pre-discharge signal to at least one of said first pre-discharge circuit and said second pre-discharge circuit, said first pre-charge signal and said pre-discharge signal being provided in accordance with said decoded desired ROM memory bank address.

2. A system according to claim 1 further including a voltage source characterized by a charge, said voltage source coupled to at least one of said first pre-charge circuit and said second pre-charge circuit for providing said charge to at least one of said first pre-charge circuit and said second pre-charge circuit, said charge being provided in accordance with at least one of said first pre-charge signal and said second pre-charge signal.

3. A system according to claim 2, wherein at least one of said first pre-charge circuit and said second pre-charge circuit includes a pre-charge transistor, said pre-charge transistor coupled to said voltage source, said ROM memory bank selection circuit, and to at least one of said first bit line and said second bit line, for providing said charge to at least one of said first bit line and second bit line.

4. A system according to claim 3, wherein at least one of said first pre-discharge circuit and said second pre-discharge circuit includes a pre-discharge transistor, said pre-discharge transistor coupled to at least one of said first bit line and said second bit line, to said ROM memory bank selection circuit, and to a grounding potential.

5. A system according to claim 4 wherein at least one of said first pre-charge circuit and said second pre-charge circuit pre-charge at least one of said first bit line and said second bit line in accordance with said first pre-charge signal.

6. A system according to claim 5, wherein at least one of said first pre-discharge circuit and said second pre-discharge circuit pre-discharges at least one of said first bit line and said second bit line in accordance with said first pre-discharge signal.

7. A system according to claim 6, wherein said pre-charging and said pre-discharging occurs simultaneously.

8. A system according to claim 7, further comprising at least a third ROM memory bank characterized by a third memory bank address, said third ROM memory bank including a plurality of programmable memory cells for use in storing data;

at least a third bitline coupled to at least one of said plurality of programmable memory cells of said third memory bank;

a third pre-charge circuit coupled to said third bitline for pre-charging said at least one of said plurality of programmable memory cells of said third ROM memory bank;

a third pre-discharge circuit coupled to said third bitline for pre-discharging said at least one of said plurality of programmable memory cells of said third ROM memory bank.

9. A system according to claim 8, wherein at least said first bitline and said second bitline are pre-charged and said third bitline is pre-discharged.

10. A system according to claim 9, further including a ROM bank address decoder.

11. A system according to claim 10, wherein said ROM bank address decoder comprises an OR Gate structure, said or gate structure configured to receive data from at least one of said first bitline, said second bit line, and said third bitline, said OR gate structure further configured to provide a ROM output signal in response to said first and second pre-charged bitlines.

12. A low power Read Only Memory bank accessing system with efficient bus muxing for use with a microcontroller comprising:

(a) a Read Only Memory (ROM) circuit including at least a first ROM memory bank characterized by a first ROM memory bank address and a second ROM memory bank characterized by a second ROM memory bank address, wherein said first ROM memory bank further includes a first pre-charge line, a first pre-discharge line, and a first plurality of programmable memory cells for storing a first data, said second ROM memory bank further includes a second pre-charge line, a second pre-discharge line and a second plurality of programmable memory cells for storing a second data;

(b) a first pre-charge circuit coupled to said first pre-charge line;

(c) a second pre-charge circuit coupled to said second pre-charge line;

(d) a first pre-discharge circuit coupled to said first pre-discharge line;

(e) a second pre-discharge circuit coupled to said second pre-discharge line; and (f) a ROM memory bank selection circuit for receiving at least one of said first ROM memory bank address and said second ROM memory bank address and providing a first pre-charge signal to at least one of said first pre-charge circuit and said second pre-charge circuit, said ROM memory bank selection circuit further providing a first pre-discharge signal at least one of said first pre-discharge circuit and said second pre-discharge circuit.

13. A system according to claim 12, further including a voltage source characterized by a charge.

14. A system according to claim 13, wherein said ROM memory bank selection circuit provides said first pre-charge signal to said first pre-charge circuit, said first pre-charge circuit coupling said first pre-charge line to said voltage source in response to said first pre-charge signal permitting said voltage source to provide said charge to said first pre-charge line.

15. A system according to claim 14, wherein said ROM memory bank selection circuit provides said first pre-discharge signal to said second pre-discharge circuit, said second pre-discharge circuit coupling said second pre-discharge line to a grounding potential.

16. A system according to claim 15, wherein said providing said first pre-charge signal to said first pre-charge circuit and said providing said first pre-discharge signal occur simultaneously.

17. A system according to claim 16, wherein said first plurality of programmable memory cells provides said first data in response to a read first ROM memory bank request.

18. A system according to claim 17 further including a ROM bank address decoder for decoding at least one of said first data producing a decoded first data and said second data producing a decoded second data.

19. A system according to claim 18, wherein said ROM bank address decoder decodes said first data.

20. A system according to claim 19, further including a ROM output bus, said ROM output bus configured to receive at least one of said decoded first data and said second decoded data.

21. A system according to claim 20, wherein said ROM bank address decoder comprises one of a parallel data bus decoder, free structure data base decoder and a OR gate data bus recorder.

22. A method for providing a low power Read Only Memory Bank accessing system with efficient bus muxing for use with a microcontroller comprising the steps of:
    (a) providing a Read Only Memory (ROM) circuit, the ROM circuit, including a first ROM memory bank characterized by a first ROM memory bank address and a second ROM memory bank characterized by a second ROM memory bank address, wherein the first ROM memory bank includes a first pre-charge line, a first pre-discharge line and a first plurality of programmable memory cells for storing a first data, and the second ROM memory bank includes a second pre-charge line, a second pre-discharge line, and a second plurality of programmable memory cells for storing a second data;
    (b) providing a first pre-charge circuit coupled to the first pre-charge line;
    (c) providing a second pre-charge circuit coupled to the second pre-charge line;
    (d) providing a first pre-discharge circuit coupled to the first pre-discharge line;
    (e) providing a second pre-discharge circuit coupled to the second pre-discharge line;
    (f) providing a bank selection circuit configured to communicate with at least of the first pre-charge circuit and the second pre-charge circuit.

23. A method according to claim 22, further including the step of activating the first pre-charge circuit in accordance with a ROM read request, the activation of the first pre-charge circuit including providing a voltage charge to the first pre-charge line.

24. A method according to claim 23, further comprising the step of de-activating the first pre-discharge circuitry, and activating the second pre-discharge circuitry.

25. A method according to claim 24, further comprising the step of providing a ROM bank address decoder, the ROM bank address decoder for decoding at least one of the first data stored in the first plurality of programmable memory cells and the second data stored in the second plurality of memory cells.

26. A method according to claim 25, further comprising the step of providing the ROM bank address decoder, wherein the ROM bank address decoder is one of a parallel data bus decoder, from structure data base decoder and a OR gate database decoder.

27. A method according to claim 26, further comprising the steps of initiating a ROM read operation, the ROM read operation including a read signal, the redesigned corresponding to at least one of the first memory bank address and the second memory bank address; providing a voltage charge to at least one of the first pre-charge circuit and the second pre-charge circuit where the pre-charge circuit receiving the voltage charge corresponds to the read signal, the receiving pre-charge circuit charging at least one of the first pre-charge line and the second pre-charge lines deactivating at least one of the first pre-discharge circuit and the second pre-discharge circuit, where the deactivated pre-discharge circuit does not correspond to the read signal; decoding at least one of the first data and second data, where the decoded data corresponds to the read signal; providing the decoded data as ROM bank output.

* * * * *